US011107963B2

(12) United States Patent
Wu et al.

(10) Patent No.: US 11,107,963 B2
(45) Date of Patent: Aug. 31, 2021

(54) APPARATUS AND METHOD FOR ENHANCING FIGURE OF MERIT IN COMPOSITE THERMOELECTRIC MATERIALS WITH AEROGEL

(71) Applicant: Academia Sinica, Taipei (TW)

(72) Inventors: Maw-Kuen Wu, Taipei (TW); Phillip M Wu, San Mateo, CA (US); Yang-Yuan Chen, Taipei (TW); Chung-Chieh Chang, Taipei (TW); Pai-Chun Wei, Taipei (TW); Tian-Wey Lan, Taipei (TW); Yu-Ruei Wu, Taipei (TW)

(73) Assignee: ACADEMIA SINICA, Taipei (TW)

( * ) Notice: Subject to any disclaimer, the term of this patent is extended or adjusted under 35 U.S.C. 154(b) by 646 days.

(21) Appl. No.: 15/865,644

(22) Filed: Jan. 9, 2018

(65) Prior Publication Data

US 2018/0204992 A1    Jul. 19, 2018

Related U.S. Application Data

(63) Continuation of application No. 62/447,492, filed on Jan. 18, 2017.

(51) Int. Cl.
*H01L 35/16*  (2006.01)
*H01L 35/26*  (2006.01)
*H01L 35/34*  (2006.01)
*C01B 19/00*  (2006.01)

(52) U.S. Cl.
CPC .......... *H01L 35/16* (2013.01); *C01B 19/007* (2013.01); *H01L 35/26* (2013.01); *H01L 35/34* (2013.01)

(58) Field of Classification Search
CPC .......... H01L 35/16; H01L 35/26; H01L 35/34
See application file for complete search history.

(56) References Cited

U.S. PATENT DOCUMENTS

2015/0093850 A1*   4/2015  Pen .................... B01J 13/0091
                                                           438/54

OTHER PUBLICATIONS

Ganguly. Synthesis and characterization of metal chalcogenide nanostructured materials for thermoelectric applications. (2011). Wayne State University Dissertations. Paper 409. (Year: 2011).*
Hsu. Enhancing Figure of Merit of Bi0.5Sb1,5Te3 Through Nanocomposite Approach. China Steel Technical Report, No. 27, pp. 57-63, (2014). (Year: 2014).*
Lee. Doping effects on the thermoelectric properties of Cu-intercalated Bi2Te2.7Se0.3. Current Applied Physics vol. 15, Issue 3 , Mar. 2015, pp. 190-193 (Year: 2015).*

(Continued)

*Primary Examiner* — Matthew E. Hoban
(74) *Attorney, Agent, or Firm* — Meagher Emanuel Laks Goldberg & Liao, LLP

(57) ABSTRACT

At least one of the present embodiments generally relates to an apparatus and a method for enhancing the figure of merit (zT) in composite thermoelectric materials using aerogel such as e.g., silicate/silica aerogel, carbon aerogel, chalcogenide aerogel and metal oxide aerogel. For example, the present embodiments provide apparatuses and methods for the addition of aerogels to two commonly used p and n type thermoelectric materials and thereby enhancing their thermoelectric figure of merits to record levels.

7 Claims, 12 Drawing Sheets

(56) References Cited

OTHER PUBLICATIONS

Kitagawa. Thermoelectric Properties of Bi0.5Sb1.5Te3 Prepared by Liquid-Phase Growth Using a Sliding Boat. Journal of Electronic Materials, vol. 42, No. 7, 2013 (Year: 2013).*
DiSalvo, "Thermoelectric Cooling and Power Generation", Science, vol. 285, Jul. 30, 1999, pp. 703-706.
Snyder et al., "Complex thermoelectric materials", Nature Materials, vol. 7, Feb. 2008, pp. 105-114.
Bell, "Cooling, Heating, Generating Power, and Recovering Waste Heat with Thermoelectric Systems", Science, vol. 321, Sep. 12, 2008, pp. 1457-1461.
Nielsch et al., "Thermoelectric Nanostructures: From Physical Model Systems towards Nanograined Composites", Adv. Energy Mater., vol. 1, Issue 5, Oct. 2011, pp. 713-731.
Dresselhaus et al., "New Directions for Low-Dimensional Thermoelectric Materials", Adv. Mater., vol. 19, Issue 8, Apr. 2007, pp. 1043-1053.
Pei et al., "Convergence of electronic bands for high performance bulk thermoelectrics", Nature, vol. 473, May 5, 2011, pp. 66-69.
Heremans et al., "When thermoelectrics reached the nanoscale", Nature Nanotechnology, vol. 8, Jul. 2013, pp. 471-473.
Kim et al., "Dense dislocation arrays embedded in grain boundaries for high-performance bulk thermoelectrics", Science, vol. 348, Issue 6230, Apr. 3, 2015, pp. 109-114.
Ghaemi et al., "In-Plane Transport and Enhanced Thermoelectric Performance in Thin Films of the Topological Insulators Bi(2)Te(3) and Bi(2)Se(3)", Phys. Rev. Lett., vol. 105, Issue 16, Oct. 15, 2010, 166603.
Hamdou et al., "The influence of a Te-depleted surface on the thermoelectric transport properties of Bi(2)Te(3) nanowires". Nanotechnology, vol. 25, No. 36, 2014, 365401.
Hsiung et al., "Surface-dominated transport and enhanced thermoelectric figure of merit in topological insulator Bi(1.5)Sb(0.5)Te(1.7)Se(1.3)", Nanoscale, vol. 7, 2015, pp. 518-523.
Biswas et al., "Strained endotaxial nanostructures with high thermoelectric figure of merit", Nature Chemistry, vol. 3, Feb. 2011, pp. 160-166.
Biswas et al., "High-performance bulk thermoelecliics with all-scale hierarchical architectures", Nature, vol. 489, Sep. 20, 2012, pp. 414-418.
Li et al., "BiSbTe-Based Nanocomposites with High ZT: The Effect of SiC Nanodispersion on Thermoelectric Properties", Adv. Funct. Mater., vol. 23, 2013, pp. 4317-4323.
Liu et al., "Thermoelectric Property Studies on Cu-Doped n-type Cu(x)Bi(2)Te(2.7)Se(0.3) Nanocomposites", Adv. Energy Mater. vol. 1, 2011, pp. 577-587.
Wu et al., "Large Thermoelectric Power Factor Enhancement Observed in InAs Nanowires", Nano Lett., vol. 13, 2013, pp. 4080-4086.
Scherrer et al., CRC Handbook of Thermoelectrics, D. M. Rowe, Ed., (CRC Press: Boca Raton, FL, 1995).
Jiang et al., "Fabrication and thermoelectric performance of textured n-type Bi(2)(Te,Se)(3) by spark plasma sintering", Materials Science and Engineering B, vol. 117, 2005, pp. 334-338.

* cited by examiner (A)

(B)

US 11,107,963 B2

APPARATUS AND METHOD FOR ENHANCING FIGURE OF MERIT IN COMPOSITE THERMOELECTRIC MATERIALS WITH AEROGEL

RELATED APPLICATION

This application claims the priority and all the benefits of U.S. Provisional Application No. 62/447,492 filed on Jan. 18, 2017, the content of which is hereby incorporated by reference in its entirety.

FIELD OF THE INVENTION

At least one of the present embodiments generally relates to an apparatus and a method for enhancing the figure of merit (zT) in composite thermoelectric materials using aerogel such as e.g., silicate/silica aerogel, carbon aerogel, chalcogenide aerogel and metal oxide aerogel. For example, the present embodiments provide apparatuses and methods for the addition of aerogels to two commonly used p and n type thermoelectric materials and thereby enhancing their thermoelectric figure of merits to record levels.

BACKGROUND INFORMATION

This section is intended to introduce a reader to various aspects of art, which may be related to various aspects of the present embodiments that are described and/or claimed below. This discussion is believed to be helpful in providing the reader with background information to facilitate a better understanding. Accordingly, it should be understood that these statements are to be read in this light, and not as admissions of prior art. The various referenced documents are listed at the end of this patent specification.

Thermoelectric materials offer a great potential for directly converting waste heat into electricity, and have recently attracted a lot of attention in renewable energy application. The performance of thermoelectric material is usually assessed by the dimensionless figure of merit, $zT=\alpha^2\sigma/\kappa T$, where T, $\alpha$, $\sigma$ and $\kappa$ are absolute temperature, Seebeck coefficient, electrical and thermal conductivity, respectively. These parameters depend highly on materials' lattice and electronic structures. Large power factor $\alpha^2\sigma$ and low thermal conductivity $\kappa$ are two key materials' characteristics to achieve high performance with high zT value. Unfortunately, these parameters are intricately tied to one another in bulk materials, for example, lowering thermal conductivity results in less electrical conductivity.

Many methods including zone melting or Bridgman technology [1,2], element doping [3,4], annealing treatment [5], wet-chemical synthesis followed by hot pressing or spark plasma sintering [7], and some film processing techniques [7,8] have been reported to make zT surpass 1 or even 2. There were several proposals in recent years to use the controlled scattering of phonons in nanostructured thermoelectric materials for enhancement of zT. Enhancement of zT can be achieved through increasing phonon scattering by defects and grain boundaries. For example, Zhu et al. [9-11] adopted a hot deformation technology to induce a donor-like effect and variety of defects in zone-melted alloys, which can respectively adjust the carrier concentration and reduce the thermal conductivity, resulting in the improvement of zT value.

Aerogel (AG) is a synthetic porous ultralight material derived from a gel, in which the liquid component of the gel has been replaced with a gas. For example, silica aerogels are aerogels produced from silica gels. Silica aerogels have been referred as "frozen smoke" by their nebulous appearance. Typically, silica aerogels will appear yellowish if a light source is viewed through them, and appear light blue under sunlight.

SUMMARY

The present inventors recognize that to improve the applicability of superconducting materials, a proper mixing of extra impurities, without critically affecting the superconducting characteristics, to enhance vortex pinning is the most effective approach. Using this idea for thermoelectric material, if we can add at the interface materials that could lead to higher power factor in the meantime to pin thermal conduction then we might have the opportunity to substantially enhance zT of the material.

To implement the present arrangements, we use e.g., silicate aerogel, which is an inert material with extremely low density. The present embodiments utilize the synthesis and thermoelectric properties, and observation of enhanced zT in thermoelectric materials, which included n type, p type nano-composites, with the addition of small amount of silica-aerogel. After adding the silicate-aerogel (~0.6 wt %), the zT of n type material ($Cu_{0.01}Bi_2Se_{0.3}Te_{2.7}$) reaches 1.12 at 425 K while a zT of 1.9 at ~320 K for p type material ($Bi_{0.5}Sb_{1.5}Te_3$+25% Te), and reaches a maximum zT of 1.7 at 550 K in $MgAg_{0.97}Sb_{0.99}$ −0.3 wt % AG intercalated samples. These results confirm that adding silicate aerogel indeed leads to better thermoelectric performance.

Accordingly, in one exemplary embodiment, a process is presented for producing an increase in figure of merit zT for a composite thermoelectric material to produce an aerogel-added composite thermoelectric material with the increased figure of merit zT, the process comprising mixing aerogel with the composite thermoelectric material.

In another embodiment according to the present arrangements, an aerogel-added composite thermoelectric material with an increased figure of merit zT than that of an original composite thermoelectric material is presented, wherein the enhanced composite thermoelectric is manufactured by a process of mixing aerogel with the composite thermoelectric material.

Seebeck coefficient of n-type CuBiTeSe, (E) thermal conductivity of n-type CuBiTeSe, and (F) power factor of n-type CuBiTeSe.

Figure 7:
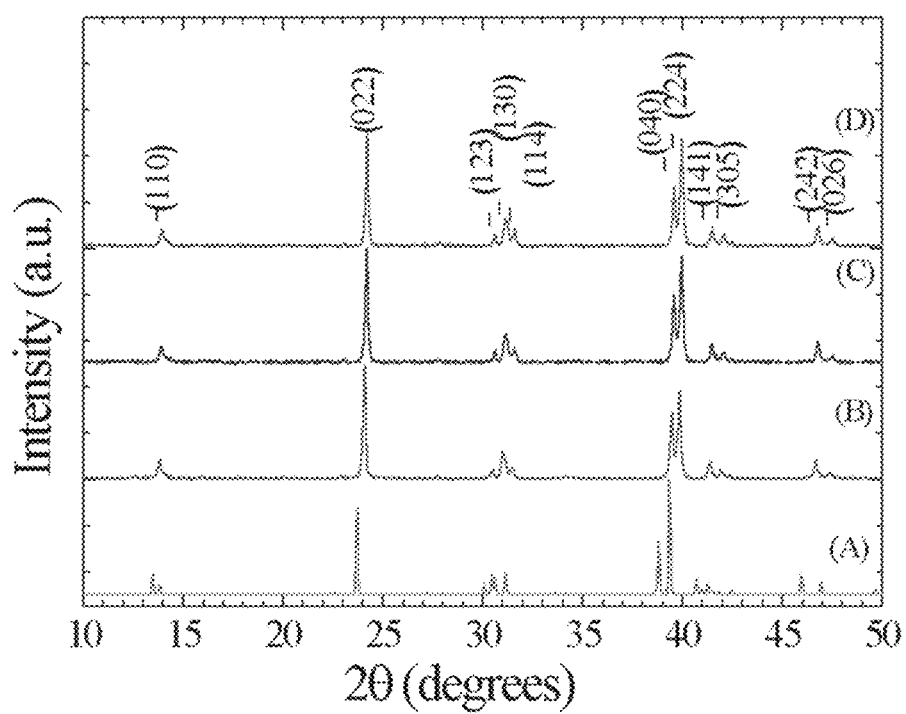
Figure 8A:
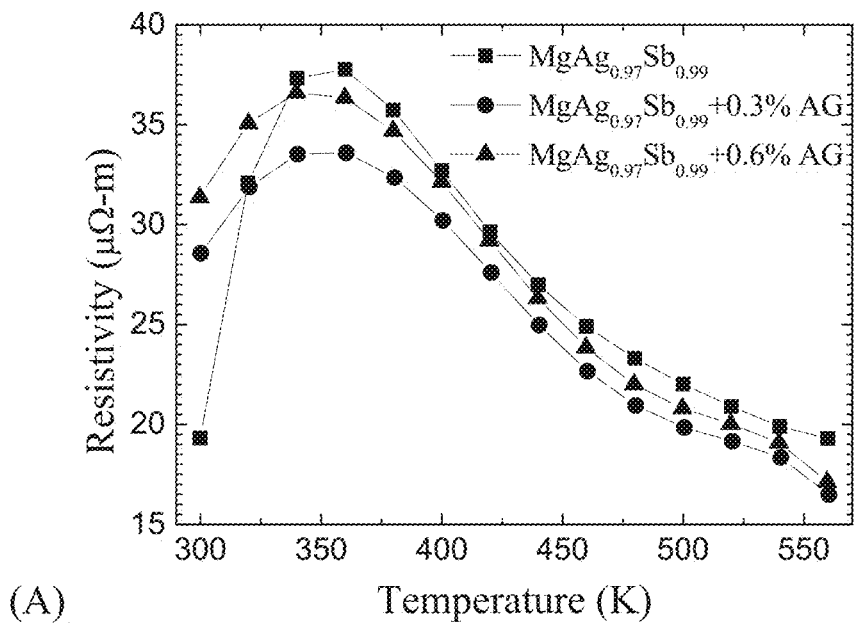
Figure 8B:
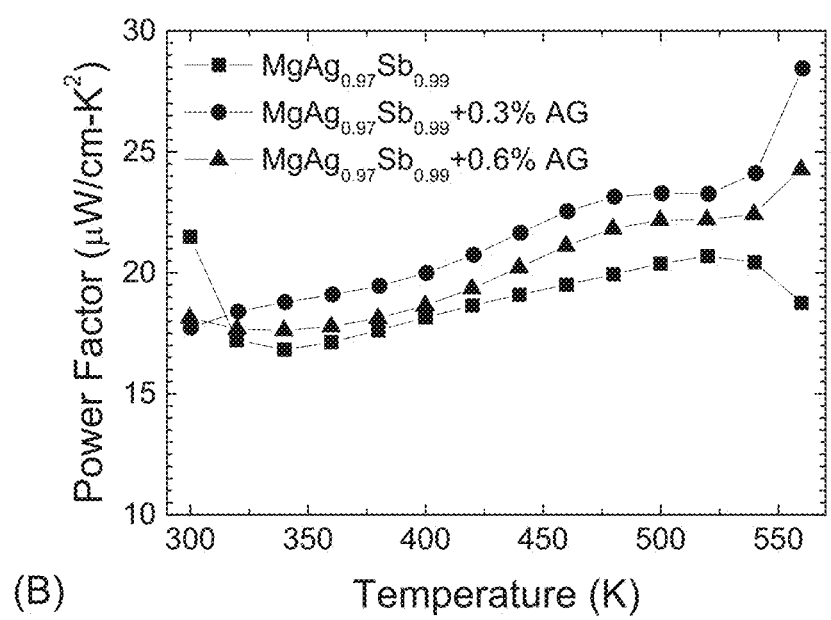
Figure 8C:
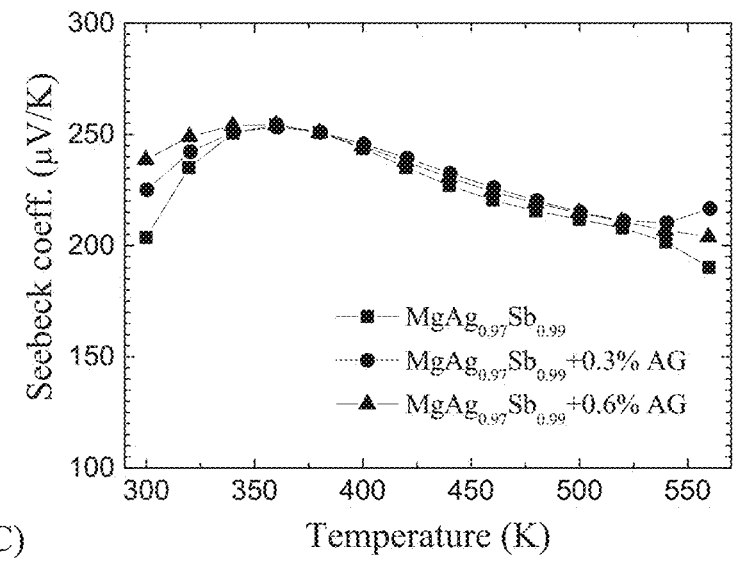
Figure 8D:
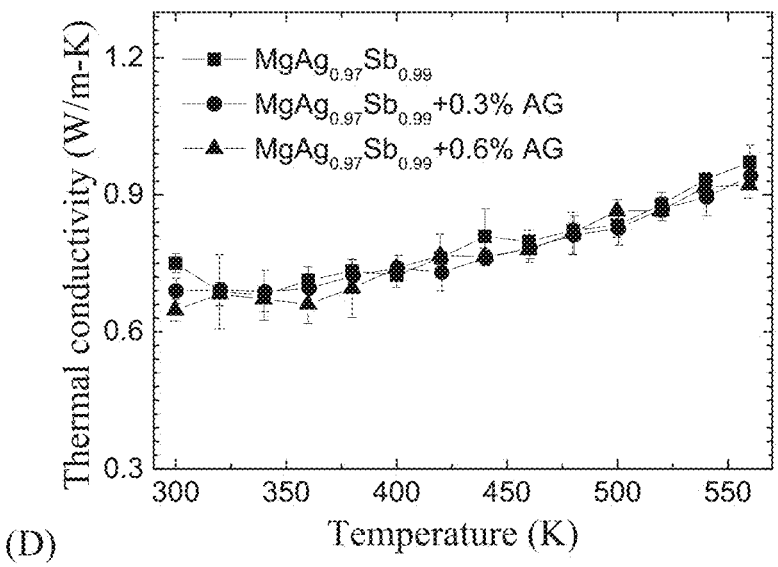

FIG. 7 shows respectively XRD pattern for: (A) $MgAg_{0.97}Sb_{0.99}$-calculated (B) $MgAg_{0.97}Sb_{0.99}$ (C) $MgAg_{0.97}Sb_{0.99}$-0.3% Aerogel intercalated sample (D) $MgAg_{0.97}Sb_{0.99}$-0.6% Aerogel intercalated sample. Note the x-ray powder diffraction pattern of MgAgSb series samples without any impurity phase.

FIG. 8A to FIG. 8D show respectively thermoelectric properties of $MgAg_{0.97}Sb_{0.99}$ intercalated with aerogel (AG) samples, in particular, the temperature dependence of: (A) resistivity, (B) power factor, (C) Seebeck coefficient, and (D) thermal conductivity.

Figure 9:
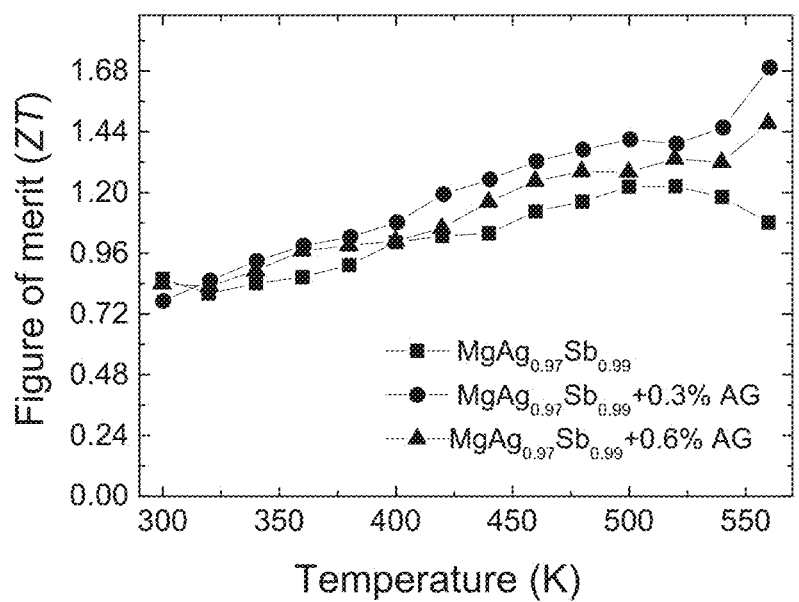

FIG. 9 shows the figure of merit (ZT) of $MgAg_{0.97}Sb_{0.99}$ and $MgAg_{0.97}Sb_{0.99}$-AG samples.

DETAILED DESCRIPTION

Thermoelectric processes refer to the direct conversion of electrical and thermal energy via electron or hole carriers according to Seebeck and Peltier effects. Such processes are promising for their potential in e.g., waste heat recovery, in thermal management of microelectronics and biological systems, and in powered solid state cooling and refrigeration. These fundamental energy exchanges can be in all materials, but with varying efficiency, which has been quantified with a dimensionless figure of merit $zT=\sigma S^2/K$. For efficient heat-electricity exchange in a typical use scenario, a value of zT>1 would be desirable. However, the zT values for most combinations of $\sigma$ (electrical conductivity), S (Seebeck coefficient), and $\kappa$ (thermal conductivity) in current materials only approach 1.5 for hole carrier systems, and roughly 1 in electron systems.

The existing zT values are the result of already tremendous progress in enhancing zT by reducing lattice thermal conductivities via novel composite texturing and grain boundary engineering growth techniques. In particular, it was recently found that mixing extra Te into $Bi_{0.5}Sb_{1.5}Te_3$ using grain boundary engineering, lowers the thermal conductivity and results in zT=1.86 at 320 K (8). This family of materials is also known for its topological surface characteristics. Studies have also shown that additional composite texturing may also hold promise for enhancing thermoelectric performance.

Part (I)—Aerogel Added Bi—Sb—Te Based Materials

We first report record enhanced zT values in silicate aerogel nanocomposite $Bi_{0.5}Sb_{1.5}Te_3$, which is p-type materials with zT=1.9 at 300 to 350 K, and in n-type $Cu_{0.01}$—$Bi_2Te_{2.7}Se_{0.3}$ that zT>1.1 over a broad temperature range with maximum zT=1.12 at 425 K. The primary gains in zT come from a reduced thermal conductivity for the aerogel mixed samples. An important find is that the resistivity is overall lowered for p-type system with addition of aerogel, while resistivity becomes higher in n-type material with aerogel included. This suggests the aerogel is effective in localizing electron carriers in both materials. In the p-type, at optimal tuning, the power-factor is enhanced considerably in samples with aerogel, while in the n-type there is not a significant change in power factor. Mixing aerogels into thermoelectric materials is therefore a promising route to reduce thermal conductivities and enhance ZT without the typical significant reduction in electrical conductivity.

Figure 1:
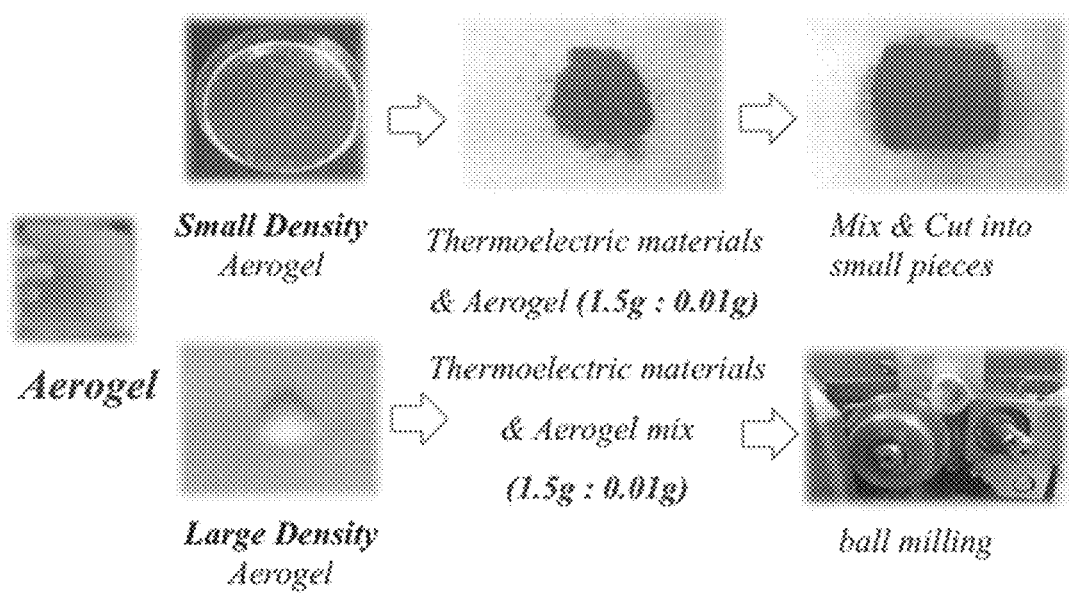
FIG. 1 is an illustration of exemplary preparation of the samples with aerogel. Aerogels are prepared as either low or high density and then mixed with the thermoelectric materials and using spark plasma sinter process to make into pellet.

An exemplary process to prepare the aerogel-added composites is shown in FIG. 1. As illustrated in FIG. 1, aerogels are prepared as either low or high density and then mixed with the thermoelectric materials and using spark plasma sinter process to make into pellet. Accordingly, in detail, to make polycrystalline samples, appropriate amounts of elemental Bi (99.99%, Alfa Aesar, 200 mesh), Sb (99.99%, 200 mesh), Te (99.99%, 200 mesh), Cu (99.99%, 200 mesh) (from Alfa Aesar) were mixed with the stoichiometric ratio $Bi_{0.5}Sb_{1.5}Te_3$ and $Cu_xBi_{0.5}Sb_{1.5}Te_3$ (x=0.01), loaded into quartz tubes (10 mm diameter, 1 mm wall thickness) and then sealed under vacuum ($10^{-6}$ torr). The sealed tubes were put into a vertical furnace and heated to 973 K over 10 h and then held there for 120 h. The tubes were slowly cooled to 573 K over 8 h and then quenched to room temperature in air. The obtained polycrystalline ingots were ground into micro-sized powders and then were densified by SPS (SPS-5155) at 673 K with holding time for 5 minutes under uniaxial pressure of 50 MPa in vacuum (3,4).

We used the field emission scanning electron microscope (FESEM), X-ray diffraction (PANalytical X'Pert Powder), and energy dispersive spectrometer (EDS), respectively, to study the microstructure, the crystalline phase and composition of the milled $Cu_xBi_{0.5}Sb_{1.5}Te_3$. We also employed the Rietveld refinement to calculate the lattice constants of samples. We used the standard four-probe technique, with a ZEM-3, ULVAC system, to measure the electrical conductivity and Seebeck coefficient on bar specimens (2 mm×2 mm 8 mm). The thermal conductivity was calculated from the relationship K=DCpd, where D is the thermal diffusivity; $C_p$, the specific heat; d, the mass density, respectively. Thermal diffusivity measurements were performed on disk specimens with 10 mm in diameter and ~2 mm in thickness by laser flash using the laser flash method (LFA457, Netzsch). The specific heat $C_p$ from 300 to 500 K was measured using a differential scanning calorimeter (DSC-Q100, TA). The sample density was measured by the Archimedes method. Hall measurement was performed in the Quantum Design physical properties measurement system (PPMS, Quantum Design) from 10 to 400 K and the Hall coefficient $R_H$ was obtained using the Van der Pauw technique under a reversible magnetic field of 9 T.

TABLE 1

Lattice parameters of the P-type Materials Studied

| Name | Crystal symmetry | Space group | B | c | α | β | γ |
|---|---|---|---|---|---|---|---|
| $Bi_{0.5}Sb_{1.5}Te_3$ | Hexagonal | R3m | 4.3 Å | 30.28 Å | 90° | 90° | 120° |
| $Cu_{0.01}Bi_2Te_{2.7}Se_{0.3}$ | Hexagonal | R3m | 4.3052 Å | 30.583 Å | 90° | 90° | 120° |

Figure 2A:
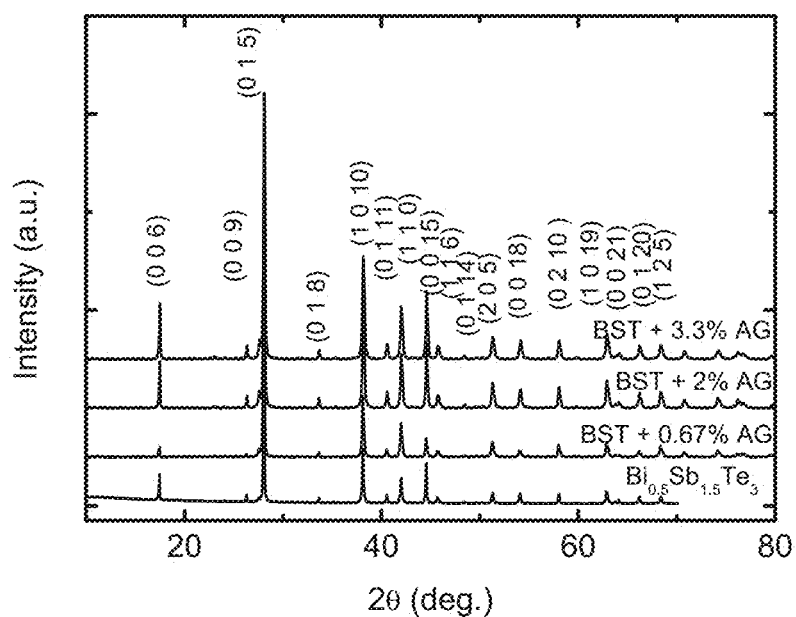
FIG. 2A and FIG. 2B show respectively: (A) the powder X-ray diffraction patterns, and (B) the lattice constant of the bulk $Bi_{0.5}Sb_{1.5}Te_3$ mixed with silica aerogel samples.
Figure 2B:
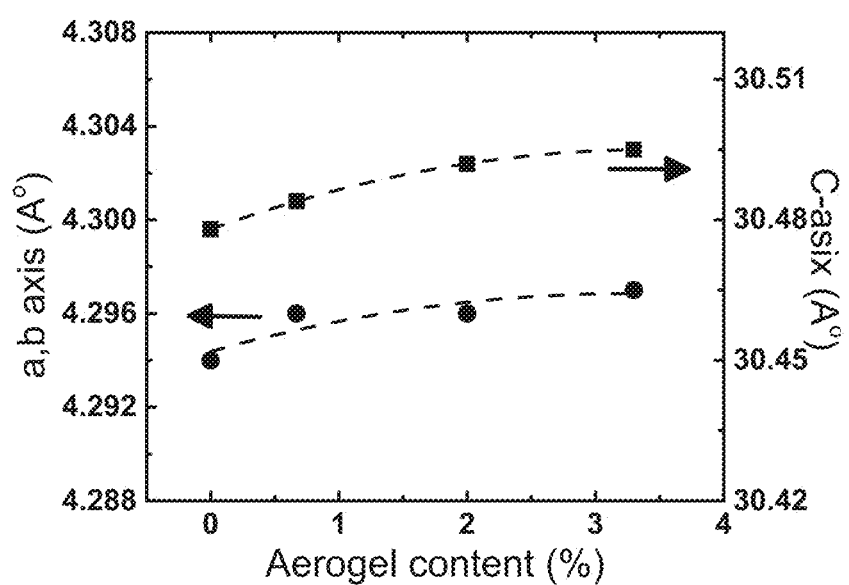
Figure 3:
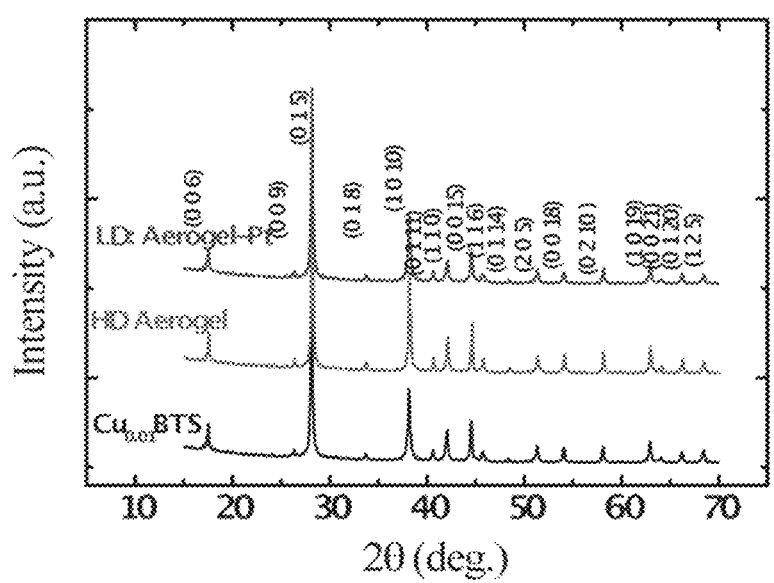
FIG. 3 shows respectively: XRD (X-ray diffraction) pattern of a) $Cu_{0.01}$—$Bi_2Te_{2.7}Se_{0.3}$ (bottom graph), b) with addition of high density aerogel (middle graph), and c) with inclusion of low density aerogel (top graph).

$Bi_{0.5}Sb_{1.5}Te_3$ has hexagonal crystal symmetry, with space group R3m and group number 166, the details of which are presented in Table 1, and its x-ray diffraction (XRD) pattern shown in FIG. 2 (the bottom graph). $Cu_{0.01}$—$Bi_2Te_{2.7}Se_{0.3}$ is also in the R3m space group with hexagonal crystal symmetry (see Table 1 and the bottom XRD graph in FIG. 3). Samples with aerogel included are shown respectively in the other graphs in FIG. 3.

Figure 4A:
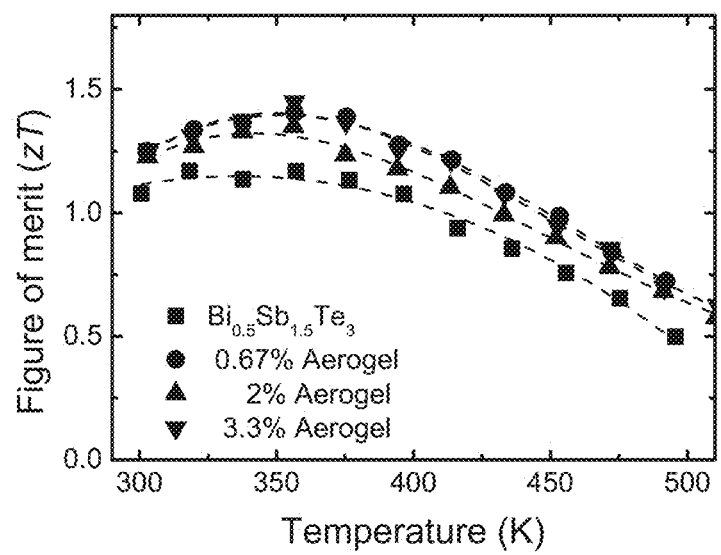
FIG. 4A and FIG. 4B show respectively: (A) zT of p-type BiSbTe, and with additional of aerogel, and (B) zT of n-type CuBiTeSe, and with addition of aerogel.
Figure 4B:
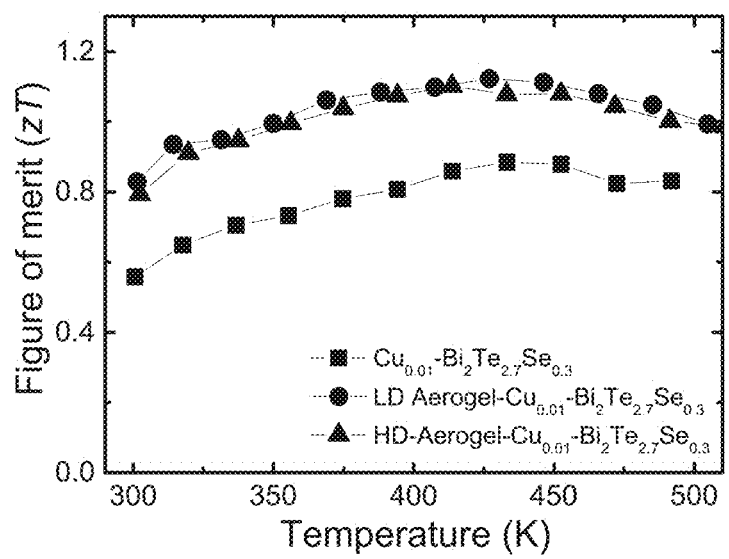

In FIG. 4A we show the zT for the p-type $Bi_{0.5}Sb_{1.5}Te_3$ thermoelectric material. The square dotted curve denotes the starting material with zT slightly larger than 1 from 300 to 400 K. zT in all the samples begins to drop at temperatures greater than 400° C. Our samples show record performance for $Bi_{0.5}Sb_{1.5}Te_3$ compounds compared to those existing in literatures. FIG. 4B shows the zT of the n-type $Cu_{0.01}$—$Bi_2Te_{2.7}Se_{0.3}$ sample in the square dotted curve. While our starting material does not yet match the record value of zT=1 at 373 K in literature, the Si aerogel addition pushes zT to record levels. zT is found to be ~1.1 from 350 to 450 K, with peak value of zT=1.12 at 425 K.

To understand more in depth the role of the Si aerogel when mixed into the p- and n-type thermoelectric materials, we compare in detail the transport parameters that determine zT, $\sigma=1/\rho$, S, and K. We find that Si aerogel serves two purposes: 1) as preferential carrier type scattering center, and 2) to lower thermal conductivity of samples. These two effects combine to enhance zT in the materials.

Figure 5A:
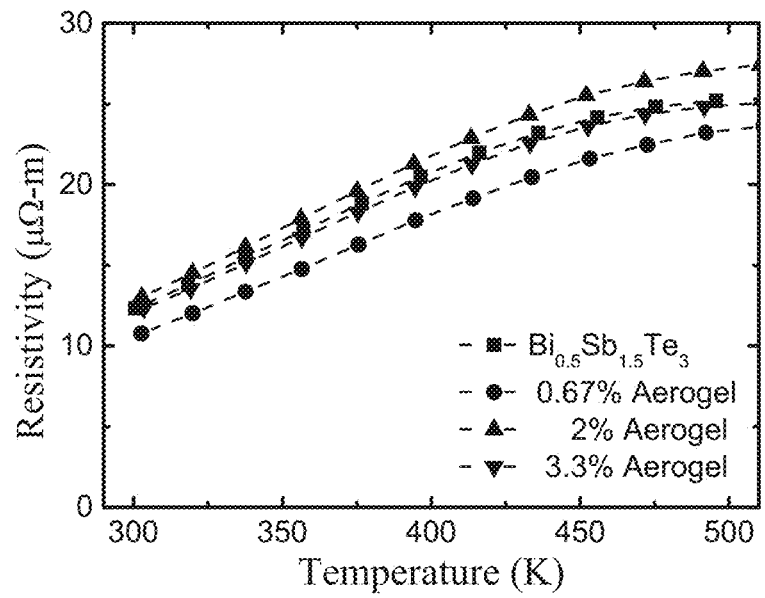
FIG. 5A and FIG. 5B show respectively: (A) resistivity of p-type BiSbTe, and (B) resistivity of n-type CuBiTeSe.
Figure 5B:
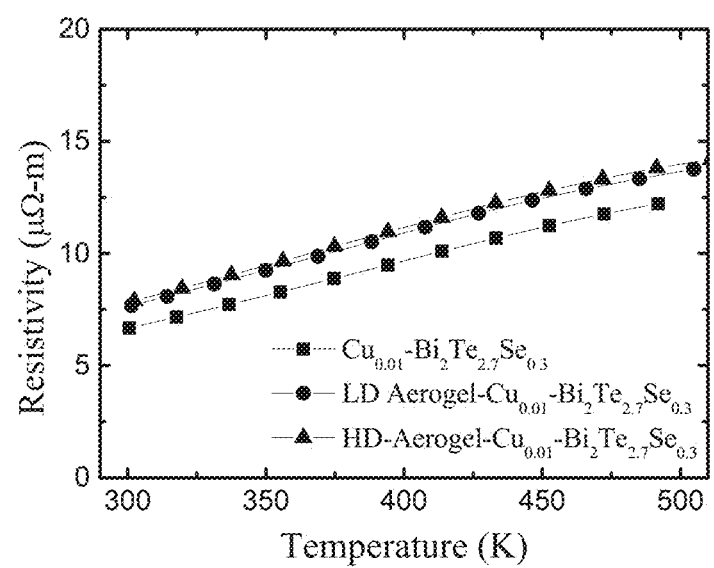
Figure 6A:
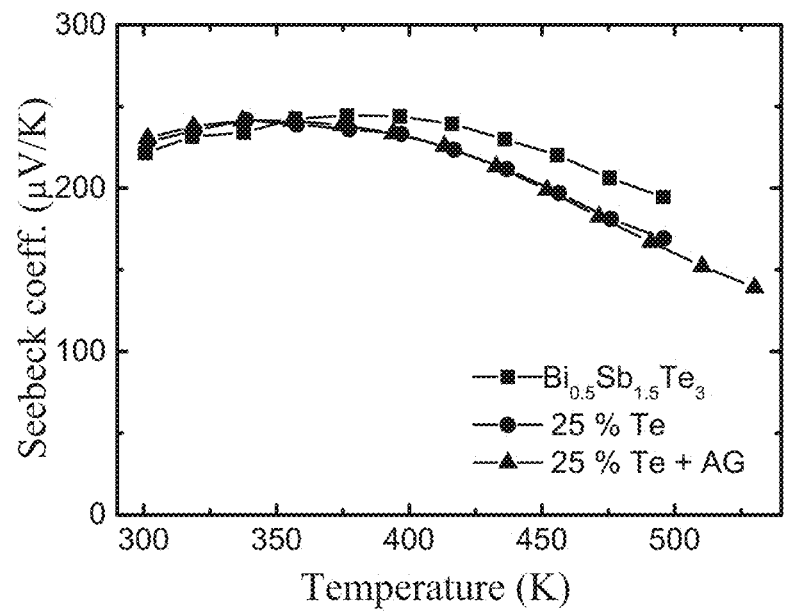
FIG. 6A to FIG. 6F show respectively: (A) Seebeck coefficient of p-type BiSbTe, (B) thermal conductivity of p-type BiSbTe, (C) power factor of p-type BiSbTe, (D)
Figure 6B:
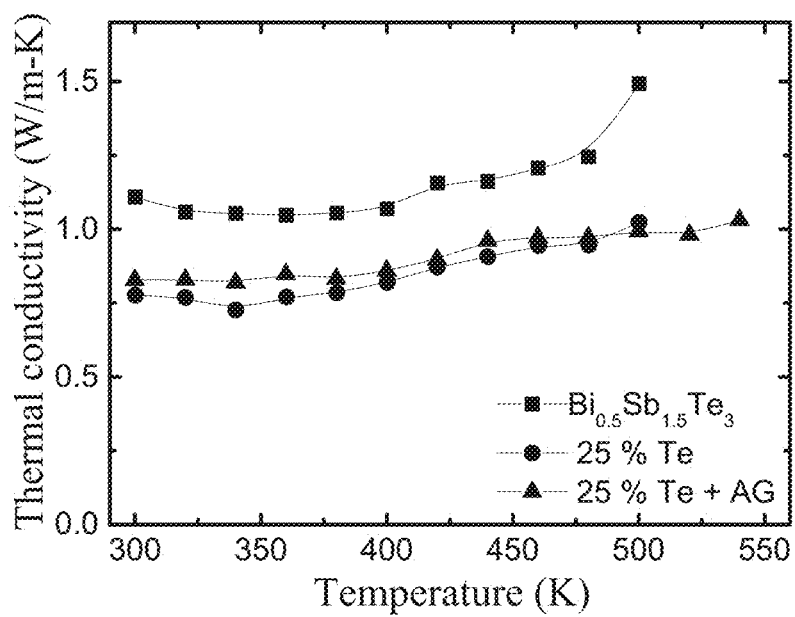
Figure 6C:
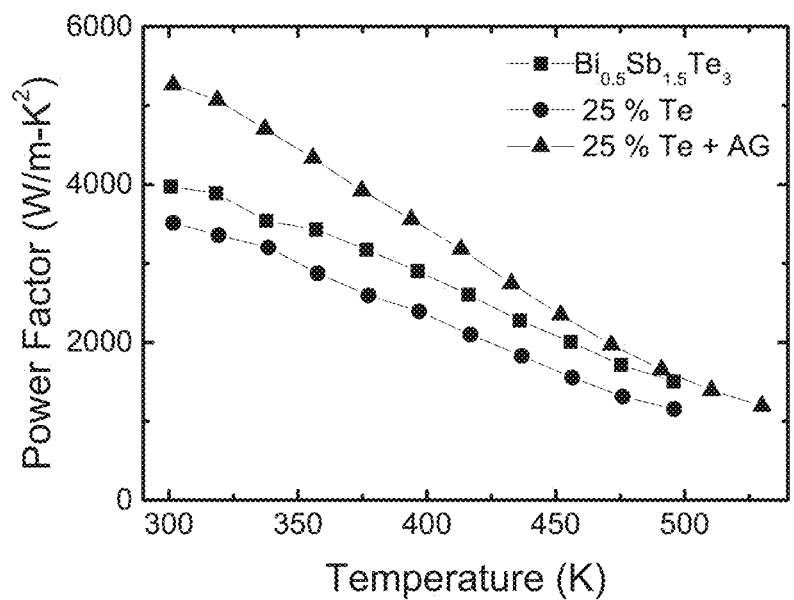
Figure 6D:
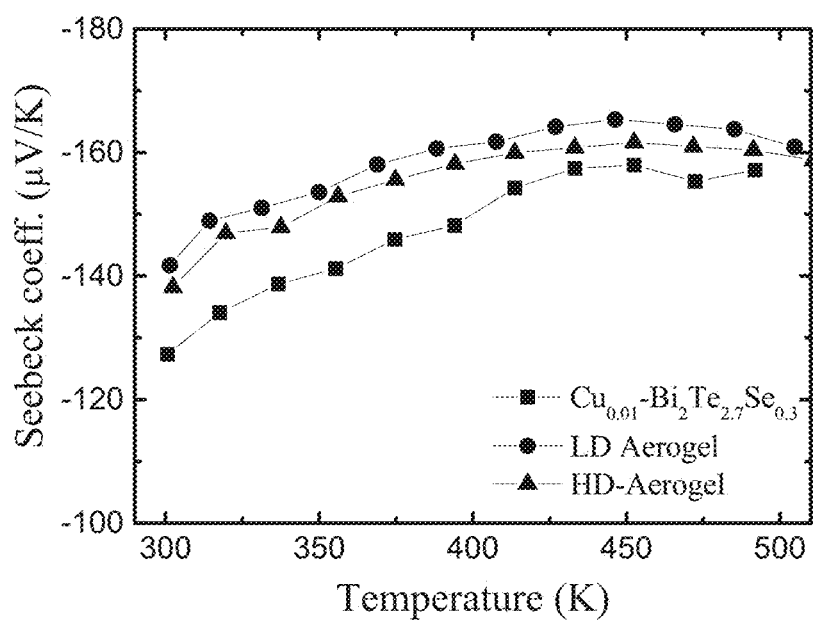
Figure 6E:
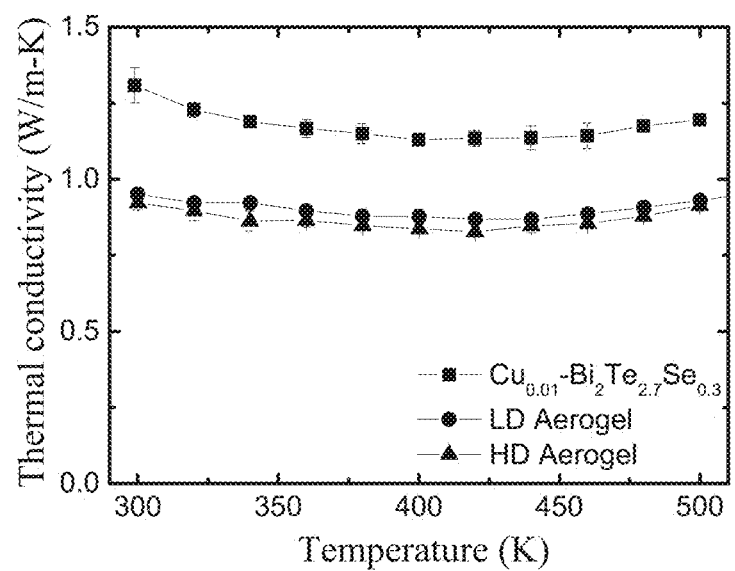
Figure 6F:
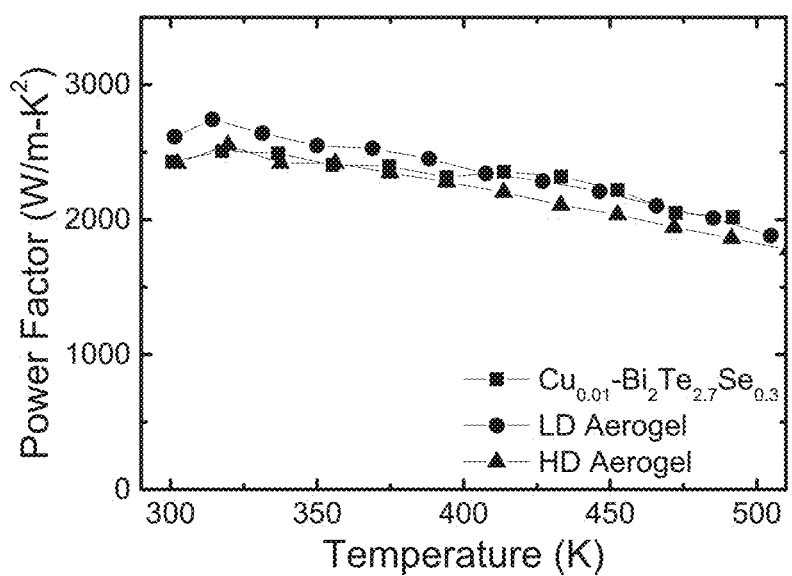

FIG. 5A and FIG. 5B show respectively: (A) resistivity of p-type BiSbTe, and (B) resistivity of n-type CuBiTeSe, with different concentration of aerogel mixed in. When adding Si aerogel to the $Bi_{0.5}Sb_{1.5}Te_3$, the resistivity is shown to decrease (conductivity is enhanced), with the largest decrease being about 14% at high temperatures. In FIG. 5B, the resistivity trend for $Cu_{0.01}$—$Bi_2Te_{2.7}Se_{0.3}$ is shown. While the change is not as significant as in the p-type material, there is a trend towards a larger resistivity (lower conductivity) for samples with Si aerogel. We note that power factor of n-type BiTeSe has been reported to be sensitive to crystal direction [12]. Extra electrons possibly come from additional Te vacancies introduced during synthesis (with finer grains) [13]. In the Si aerogel samples, we do not observe significant effects from vacancies, and even if present, the aerogel scattering nonetheless dominates the electrical resistivity behavior. Comparing the resistivity trends in the n- and p-type aerogel samples shows that the addition of Si aerogel preferentially scatters n-type carriers. In addition to preferential electronic carrier type scattering, the Si aerogel lowers the overall thermal conductivity of the thermoelectric materials by 20% to 25%, as shown in FIG. 6B and FIG. 6E. Reduced thermal conductivity is the primary factor contributing to enhanced zT.

In Part (I) above, we demonstrated how addition of Si aerogels can enhance the zT of the two most commonly used n- and p-type thermoelectric materials to record levels. In n-type $Cu_{0.01}Bi_2Te_{2.7}Se_{0.3}$, we find zT>1 over a 100 K temperature range from 350 to 450 K, with peak zT=1.12 at 425 K. P-type $Bi_{0.5}Sb_{1.5}Te_3$ is found to have even higher zT=1.9 over a temperature range of 300 to 350 K. These results show nanocomposite thermoelectric materials with Si aerogels to be extremely promising for higher efficiency performance. The enhanced zT for samples with Si aerogel are primarily the result of a reduced lattice thermal conductivity, as well as enhanced power factor for the p-type material. We find that the Si aerogel also act as preferential carrier type scattering centers in the materials, predominantly scattering n-type carriers instead of p-type in both the $Bi_{0.5}Sb_{1.5}Te_3$ and $Cu_{0.01}$—$Bi_2Te_{2.7}Se_{0.3}$. We believe these processes may also work for other materials, suggesting that mixing Si aerogel into thermoelectric materials provides a novel and unprecedented way to optimize both the thermal conductivity and power factor in materials.

Part (II)—Characteristics of Aerogel-Added MgAgSb Materials

Thermoelectric property of Heusler and half-Heusler materials, with chemical formulas $X_2YZ$ or XYZ respectively, where usually X, the most electropositive element; Y a late transition metal; and Z, the most electronegative element, have been investigated and discussed. The structure of half-Heusler crystal with space group F ⁻43m consists of three interpenetrating face-centered cubic (FCC) lattices, forming a rocksalt-type lattice with half of the tetrahedral interstices filled. Examples include MgCuBi, MgCuSb, ZnAgAs, MgNiBi, MnCuSb, MgNiBi, and MgNiSb. MgAgSb was considered the archetypal candidate of half-Heusler materials, however, its structure was found not to have the typical half-Heusler structure but instead a tetragonal $Cu_2Sb$ crystal. It was recently reported that the MgAgSb ternary with a fluorite structure, as in the half-Heusler structure, shows very good thermoelectric properties [14-21]. In this research, we first try to optimize the material synthesis process to obtain high purity materials without impurity phases, and then to add aerogel to see how zT value can be modified.

The MgAgSb samples were synthesized by solid-state reaction, including powder ball-milling, powder agate mortar grind, and sealed in an evacuated quartz tube for heat treatment. The X-ray diffraction patterns show that the prepared samples are indeed high purity phase, as shown in FIG. 7, and the diffraction patterns also show the addition of aerogel does not change the crystal phase of $MgAg_{0.97}Sb_{0.99}$.

We investigated adding aerogel into $MgAg_{0.97}Sb_{0.99}$ to find how it changes the thermoelectric property. Aerogel intercalation into $MgAg_{0.97}Sb_{0.99}$ in principle can decrease the thermal and electrical conductivity by enhancing the electron and phonon scattering, as shown in the Part (I) study on Cu—BiTeSe and BiSbTe. The figure of merit demonstrates that adding aerogel into $MgAg_{0.97}Sb_{0.99}$ is evidently different from the pristine samples. There is a known structural transformation at about 500 K causes the decrease in zT in $MgAg_{0.97}Sb_{0.99}$ material. Our results with adding aerogel was found to reverse this trend, showing further increase in zT as temperature increases. These results are shown in FIG. 8 and FIG. 9.

It is interesting to note that the enhancement in zT in this case is not due to the decrease in thermal conductivity. The results show that the power factor is enhanced in aerogel doped samples, which arises from reduced resistivity or enhanced conductivity; this in turn leads to enhanced zT, suggesting that element substitution in MgAgSb-based materials could strongly affect the carrier concentration, and hence provide a suitable route to increase the thermoelectric zT value.

An important result of this study is to establish a simple synthesis process for MgAgSb-based system without any impurity phase, which provides a clean starting point for doping studies. The figure of merit zT of MgAgSb-based system can be enhanced to higher value than preliminary $MgAg_{0.97}Sb_{0.99}$. In $MgAg_{0.97}Sb_{0.99}$ −0.3% AG intercalated samples the zT value increases from 1.38 to 1.45 and the maximum zT value is 1.7 at 550 K. Currently, we are continuing to see whether the zT value will further increases as temperature goes higher.

In summary, we have demonstrated a large zT enhancement in bulk $Bi_{0.5}Sb_{1.5}Te_3$ nanocomposites incorporated with silica aerogel, and a record high zT~1.44 at 350 K was achieved. The major effect contributing to the large enhancement is the decrease in thermal conductivity. This intercalated thermoelectric system with aerogel content of ~30 vol. % (~3 wt. %) has a comparable low density of ~7 $g/cm^3$ and a thermal conductivity of ~0.8 W/m-K. The density, thermal, even electric conductivity of aerogel composites can be controlled by varying the aerogel content. Importantly, our report describes the process to prepare bulk-nano thermoelectric material formed by spark plasma sintering (SPS) that contains nano-scale inclusions, which are made by powder processing and modified chemical solution process, which is simple and inexpensive. Overall, the technique described here provides a possible new route for the synthesis of thermoelectric materials with improved conversion efficiency for practical applications.

Characterization and Analysis:

We used the field emission scanning electron microscope (FESEM), X-ray diffraction (PANalytical X'Pert Powder), and energy dispersive spectrometer (EDS), respectively, to study the microstructure, the crystalline phase and composition of the milled $Bi_{0.5}Sb_{1.5}Te_3$ and $Cu_{0.01}$—$Bi_2Te_{2.7}Se_{0.3}$. We also employed the Rietveld refinement to calculate the lattice constants of samples. We used the standard four-probe technique, with a ZEM-3, ULVAC system, to measure the electrical conductivity and Seebeck coefficient on bar specimens (2 mm×2 mm×8 mm). The thermal conductivity was calculated from the relationship K=DCpd, where D is the thermal diffusivity; $C_p$, the specific heat; d, the mass density, respectively. Thermal diffusivity measurements were performed on disk specimens with 10 mm in diameter and ~2 mm in thickness by laser flash using the laser flash method (LFA457, Netzsch). The specific heat $C_p$ from 300 to 500 K was measured using a differential scanning calorimeter (DSC-Q100, TA). The sample density was measured by the Archimedes method. Hall measurement was performed in the Quantum Design physical properties measurement system (PPMS, Quantum Design) from 10 to 400 K and the hall coefficient $R_H$ was obtained using the Van der Pauw technique under a reversible magnetic field of 9 T. The combined uncertainty for all measurements involved in ZT determination is about 10-15%.

The present description illustrates the present embodiments. It will thus be appreciated that those skilled in the art will be able to devise various arrangements that, although not explicitly described or shown herein, embody the present principles and are included within its spirit and scope.

All examples and conditional language recited herein are intended for pedagogical purposes to aid the reader in understanding the present principles and the concepts contributed by the inventors to furthering the art, and are to be construed as being without limitation to such specifically recited examples and conditions.

Moreover, all statements herein reciting principles, aspects, and embodiments of the present principles, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Reference in the specification to "one embodiment", "an embodiment", "an exemplary embodiment" of the present principles, or as well other variations thereof, means that a particular feature, structure, characteristic, and so forth described in connection with the embodiment is included in at least one embodiment of the present principles. Thus, the appearances of the phrase "in one embodiment", "in an embodiment", "in an exemplary embodiment", or as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

While several embodiments have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present embodiments. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings herein is/are used. Those skilled in the art will recognize, or be able to ascertain using no more than routine experimentation, many equivalents to the specific embodiments described herein. It is, therefore, to be understood that the foregoing embodiments are presented by way of example only and that, within the scope of the appended claims and equivalents thereof, the embodiments disclosed may be practiced otherwise than as specifically described and claimed. The present embodiments are directed to each individual feature, system, article, material and/or method described herein. In addition, any combination of two or more such features, systems, articles, materials and/or methods, if such features, systems, articles, materials and/or methods are not mutually inconsistent, is included within the scope of the present embodiment.

REFERENCED DOCUMENTS

1. F. J. DiSalvo, Thermoelectric Cooling and Power Generation. *Science* 285, 703-706 (1999).
2. G. J. Snyder, E. S. Toberer, Complex thermoelectric materials. *Nature Materials* 7, 105-114 (2008).
3. L. E. Bell, Cooling, Heating, Generating Power, and Recovering Waste Heat with Thermoelectric Systems. *Science* 321, 1457-1461 (2008).
4. K. Nielsch, J. Bachmann, J. Kimling, H. Bottner, Thermoelectric Nanostructures: From Physical Model Systems towards Nanograined Composites. *Adv. Energy Mater.* 1, 713-731 (2011).
5. M. S. Dresselhaus et al., New directions for low-dimensional thermoelectric materials. *Advanced Materials* 19, 1043-1053 (2007).
6. Y. Pei et al., Convergence of electronic bands for high performance bulk thermoelectrics. *Nature* 473, 66-69 (2011).
7. J. P. Heremans, M. S. Dresselhaus, L. E. Bell, D. T. Morelli, When thermoelectrics reached the nanoscale. *Nat Nano* 8, 471-473 (2013).

8. S. I. Kim et al., Thermoelectrics. Dense dislocation arrays embedded in grain boundaries for high-performance bulk thermoelectrics. *Science* 348, 109-114 (2015).
9. P. Ghaemi, R. S. Mong, J. E. Moore, In-plane transport and enhanced thermoelectric performance in thin films of the topological insulators Bi(2)Te(3) and Bi(2)Se(3). *Phys Rev Lett* 105, 166603 (2010).
10. B. Hamdou et al., The influence of a Te-depleted surface on the thermoelectric transport properties of Bi(2)Te(3) nanowires. *Nanotechnology* 25, 365401 (2014).
11. T. C. Hsiung, C. Y. Mou, T. K. Lee, Y. Y. Chen, Surface-dominated transport and enhanced thermoelectric figure of merit in topological insulator Bi(1.5)Sb(0.5)Te(1.7)Se(1.3). *Nanoscale* 7, 518-523 (2015).
12. K. Biswas et al., Strained endotaxial nanostructures with high thermoelectric figure of merit. *Nat Chem* 3, 160-166 (2011).
13. K. Biswas et al., High-performance bulk thermoelectrics with all-scale hierarchical architectures. *Nature* 489, 414-418 (2012).
14. J. Li et al., BiSbTe-Based Nanocomposites with High ZT: The Effect of SiC Nanodispersion on Thermoelectric Properties. *Adv. Funct. Mater.* 23, 4317-4323 (2013).
15. W.-S. Liu et al., Thermoelectric Property Studies on Cu-Doped n-type Cu_xBi_2Te_2.7Se_0.3 Nanocomposites. *Adv. Energy Mater.* 1, 577-587 (2011).
16. P. M. Wu et al., Large thermoelectric power factor enhancement observed in InAs nanowires. *Nano Lett* 13, 4080-4086 (2013).
17. H. Scherrer, S. Scherrer, *CRC Handbook of Thermoelectrics*. D. M. Rowe, Ed., (CRC Press: Boca Raton, Fla., 1995).
18. J. Jiang, L. Chen, S. Bai, Q. Yao, Q. Wang, Fabrication and thermoelectric performance of textured n-type Bi_2(Te,Se)_3 by spark plasma sintering. *Materials Science and Engineering B* 117, 334-338 (2005).

The invention claimed is:

1. A process for producing an increase in figure of merit zT for a composite thermoelectric material to produce an enhanced composite thermoelectric material with the increased figure of merit zT, the process comprising mixing aerogel with the composite thermoelectric material, wherein the aerogel is formed from a material different than the composite thermoelectric material and the mixing further comprises ball milling the aerogel with the composite thermoelectric material.

2. The process of claim 1 wherein the aerogel is one of 1) silicate/silica aerogel, 2) carbon aerogel, 3) chalcogenide aerogel and 4) metal oxide aerogel.

3. The process of claim 1 wherein the composite thermoelectric material is p-type.

4. The process of claim 1 wherein the composite thermoelectric material is n-type.

5. The process of claim 3 wherein the composite thermoelectric material is $Bi_{0.5}Sb_{1.5}Te_3$.

6. The process of claim 4 wherein the composite thermoelectric material is $Cu_{0.01}$—$Bi_2Te_{2.7}Se_{0.3}$.

7. The process of claim 5 further comprising adding additional Te to the $Bi_{0.5}Sb_{1.5}Te_3$.

* * * * *